(12) United States Patent
Chang et al.

(10) Patent No.: US 10,930,646 B2
(45) Date of Patent: Feb. 23, 2021

(54) CIRCUIT AND METHOD OF FORMING THE SAME

(71) Applicant: Nanyang Technological University, Singapore (SG)

(72) Inventors: Joseph Sylvester Chang, Singapore (SG); Kwen Siong Chong, Singapore (SG); Tong Lin, Singapore (SG); Ne Kyaw Zwa Lwin, Singapore (SG); Sivaramakrishnan Hariharakrishnan, Singapore (SG)

(73) Assignee: ZERO-ERROR SYSTEMS PTE LTD, Singapore (SG)

( * ) Notice: Subject to any disclaimer, the term of this patent is extended or adjusted under 35 U.S.C. 154(b) by 0 days.

(21) Appl. No.: 16/622,190

(22) PCT Filed: May 30, 2018

(86) PCT No.: PCT/SG2018/050265
§ 371 (c)(1),
(2) Date: Dec. 12, 2019

(87) PCT Pub. No.: WO2018/231148
PCT Pub. Date: Dec. 20, 2018

(65) Prior Publication Data
US 2020/0126971 A1    Apr. 23, 2020

(30) Foreign Application Priority Data

Jun. 15, 2017   (SG) ............................ 10201704950V

(51) Int. Cl.
*H01L 27/06* (2006.01)
*H01L 21/8238* (2006.01)
(Continued)

(52) U.S. Cl.
CPC .. *H01L 27/0629* (2013.01); *H01L 21/823871* (2013.01); *H01L 23/528* (2013.01);
(Continued)

(58) Field of Classification Search
CPC .... G06F 1/1616; G06F 1/1635; G06F 1/1656; G06F 1/1679; H01M 2/1022;
(Continued)

(56) References Cited

U.S. PATENT DOCUMENTS 5,220,192 A * 6/1993 Owens .............. H01L 21/76218
257/519
5,517,050 A * 5/1996 Koyabu .............. H01L 27/0255
257/328

(Continued)

FOREIGN PATENT DOCUMENTS

WO    WO-2004095583 A2 * 11/2004   ........... H01L 23/585

OTHER PUBLICATIONS

Barlow, M., et al., "A PFET-Access Radiation-Hardened SRAM for Extreme Environments," *IEEE MWSCAS*, 2008, pp. 418-421.
(Continued)

*Primary Examiner* — Mohammed Shamsuzzaman
(74) *Attorney, Agent, or Firm* — Womble Bond Dickinson (US) LLP

(57) ABSTRACT

According to embodiments of the present invention, a circuit is provided. The circuit includes forming a first electrical device having a first region of a first conductivity type, forming a second electrical device having a second region of a second conductivity type, and electrically coupling the first region and the second region to each other, wherein one of the first and second regions is arranged to at least substantially surround the other of the first and second regions. According to further embodiments of the present invention, a method of forming a circuit is also provided.

13 Claims, 7 Drawing Sheets

(51) Int. Cl.
H01L 23/528 (2006.01)
H01L 23/552 (2006.01)
H01L 27/02 (2006.01)
H01L 29/08 (2006.01)
H03K 19/003 (2006.01)

(52) U.S. Cl.
CPC ........ *H01L 23/552* (2013.01); *H01L 27/0207* (2013.01); *H01L 29/0847* (2013.01); *H03K 19/00338* (2013.01)

(58) Field of Classification Search
CPC ........... H01L 21/823871; H01L 23/528; H01L 23/552; H01L 27/0207; H01L 27/0629; H01L 27/0921; H01L 29/0692; H01L 29/0847; H01L 29/78; H03K 19/0033; H03K 19/00338; H03K 19/094
See application file for complete search history.

(56) References Cited

U.S. PATENT DOCUMENTS

| | | | |
|---|---|---|---|
| 6,410,964 B1* | 6/2002 | Shida | H01L 27/0255 257/356 |
| 7,298,010 B1 | 11/2007 | Ma | |
| 8,169,037 B2* | 5/2012 | Furuta | H01L 27/0207 257/394 |
| 8,217,458 B2 | 7/2012 | Golke et al. | |
| 8,566,770 B2* | 10/2013 | Lilja | H03K 19/20 716/119 |
| 9,081,926 B2 | 7/2015 | Lilja | |
| 2005/0156620 A1* | 7/2005 | Carlson | H03K 19/00338 326/10 |
| 2006/0097324 A1* | 5/2006 | Arai | H01L 27/118 257/357 |
| 2007/0103185 A1* | 5/2007 | Friedman | H03K 19/00338 326/14 |
| 2007/0162880 A1 | 7/2007 | Carlson et al. | |
| 2008/0099857 A1* | 5/2008 | Furuta | H01L 27/0705 257/401 |
| 2011/0303984 A1* | 12/2011 | Chen | H01L 29/41758 257/369 |
| 2014/0291771 A1* | 10/2014 | Schmid | H01L 29/0642 257/400 |
| 2015/0295571 A1 | 10/2015 | Cole et al. | |

OTHER PUBLICATIONS

Barnhart, D. J., et al., "Radiation Hardening by Design of Asynchronous Logic for Hostile Environments," *IEEE Journal of Solid-State Circuits*, May 2009, vol. 44(5), pp. 1617-1628.
Black, J. D., et al., "HBD Layout Isolation Techniques for Multiple Node Charge Collection Mitigation," *IEEE Transactions on Nuclear Science*, Dec. 2005, vol. 52(6), pp. 2536-2541.
Calin, T., et al., "Upset Hardened Memory Design for Submicron CMOS Technology," *IEEE Transactions on Nuclear Science*, Dec. 1996, vol. 43(6), pp. 2874-2878.
Casey, M. C., et al., "HBD Using Cascode-Voltage Switch Logic Gates for SET Tolerant Digital Designs," *IEEE Transactions on Nuclear Science*, Dec. 2005, vol. 52(6), pp. 2510-2515.
Chen, J., et al., "Novel Layout Technique for Single-Event-Transient Mitigation Using Dummy Transistor," *IEEE Trans. Device and Material Reliability*, Mar. 2013, vol. 13(1), pp. 177-184.
Chen, J., et al., "Radiation Hardened by Design Techniques to Reduce Single Event Transient Pulse Width Based on the Physical Mechanism," *Microelectronics Reliability*, 52, pp. 1227-1232, 2012.
Diestelhorst, R. M., et al., "Junction Isolation Single Event Radiation Hardening of a 200 GHZ SiGe:C HBT Technology Without Deep Trench Isolation," *IEEE Transactions on Nuclear Science*, Dec. 2009, vol. 56(6), pp. 3402-3407.
Dodd, P. E., et al., "Current and Future Challenges in Radiation Effects on CMOS Electronics," *IEEE Transactions on Nuclear Science*, Aug. 2010, vol. 57(4), pp. 1747-1763.
Garg, R., et al., "A Novel, Highly SEU Tolerant Digital Circuit Design Approach," *Proc. IEEE International Conference on Computer Design*, 2008, pp. 14-20.
Hoang, T., et al., "A Radiation Hardened 16-Mb SRAM for Space Applications," *IEEE Aerospace Conference*, 2007, pp. 1-6.
Jahinuzzaman, S. M., et al., "Design and Analysis of A 5.3-pJ 64-kb Gated Ground SRAM with Multiword ECC," *IEEE Journal of Solid-State Circuits*, Sep. 2009, vol. 44(9), pp. 2543-2553.
Jang, W. "Soft-error Tolerant Quasi Delay-Insensitive Circuits." PhD Thesis, 2008.
Knudsen, J. E. et al., "An Area and Power Efficient Radiation Hardened by Design Flip-Flop," *IEEE Transactions on Nuclear Science*, v. 53, No. 6, Dec. 2006, pp. 3392-3399.
Lacoe, R. C., "Improving Integrated Circuit Performance Through the Application of Hardness-by-Design Methodology," *IEEE Transactions on Nuclear Science*, Aug. 2008, vol. 55(4), pp. 1903-1925.
Lacoe, R. C., et al., "Application of Hardness-By-Design Methodology to Radiation-Tolerant ASIC Technologies," *IEEE Transactions on Nuclear Science*, Dec. 2000, vol. 47(6), pp. 2334-2341.
Lee H.-H. K. et al., "Design Framework for Soft-Error-Resilient Sequential Cells" *IEEE Transactions on Nuclear Science*, Oct. 13, 2011, vol. 58, No. 6, pp. 3026-3032.
Lee H.-H. K. et al., "LEAP: Layout Design through Error-Aware Transistor Positioning for Soft-Error Resilient Sequential Cell Design," *IEEE International Reliability Physics Symposium*, May 6, 2010, pp. 203-212.
Rodbell, K., et al., "32 and 45 nm Radiation-Hardened-By-Design (RHBD) SOI Latches," *IEEE Transactions on Nuclear Science*, Dec. 2011, vol. 58(6), pp. 2702-2710.
Yamamoto, R., et al., "An Area-Efficient 65nm Radiation-Hard Dual-Modular Flip-flop to avoid multiple cell upsets," *IEEE Transactions on Nuclear Science*, Dec. 2011, vol. 58(6), pp. 3053-3059.
Zhou, Q., et al., "Gate Sizing to Radiation Harden Combinational Logic," *IEEE Transactions on Computer-Aided Design of Integrated Circuits and Systems*, 2006, vol. 25(1), pp. 155-166.

\* cited by examiner

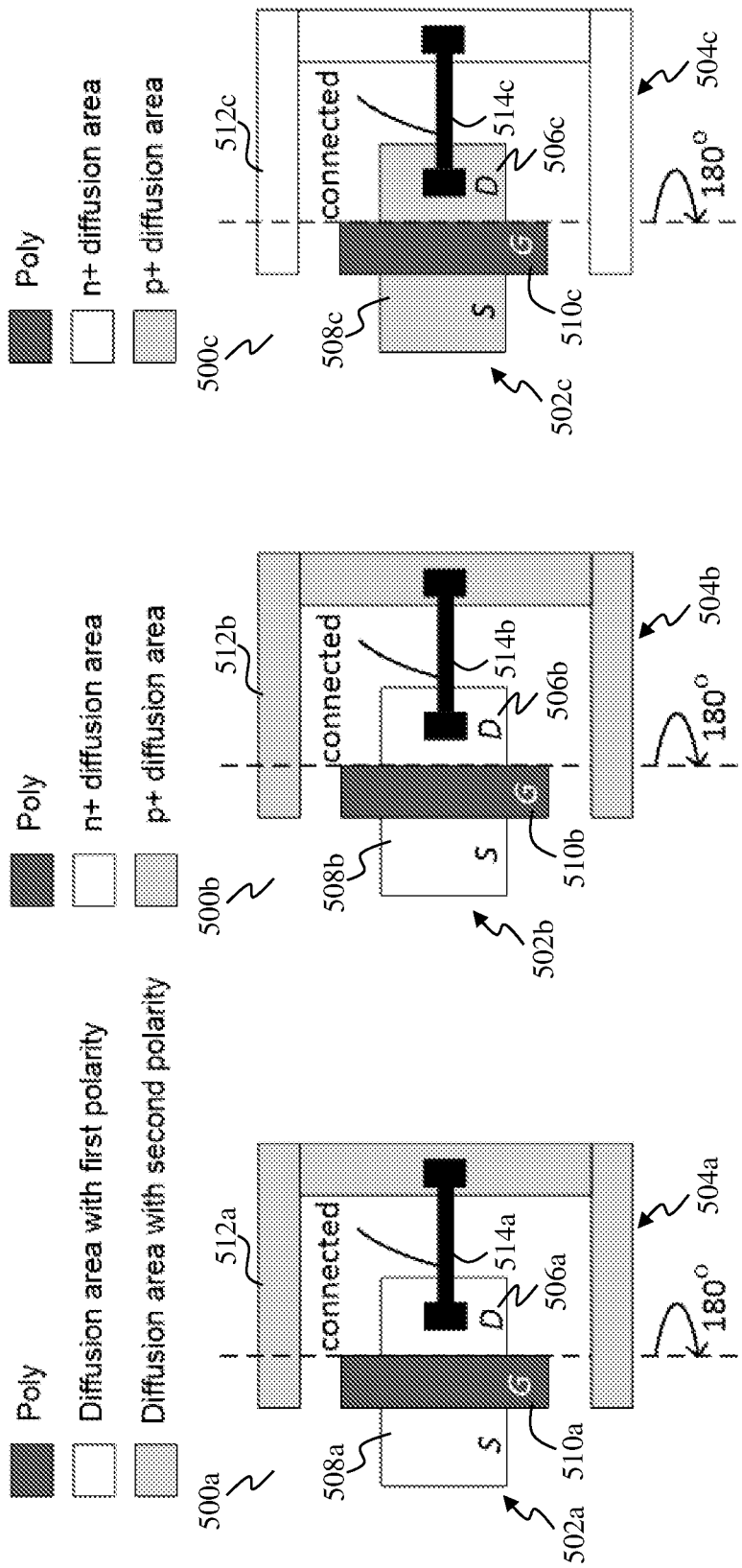

CIRCUIT AND METHOD OF FORMING THE SAME

CROSS-REFERENCE TO RELATED APPLICATIONS

This application is a national stage filing under 35 U.S.C. § 371 of PCT/SG2018/050265, filed May 30, 2018, which International Application was published by the International Bureau in English as WO 2018/231148 A1, on Dec. 20, 2018, and claims priority from Singapore Application No. 10201704950V, filed Jun. 15, 2017, which applications are hereby incorporated by reference in their entirety for all purposes in this application.

TECHNICAL FIELD

Various embodiments relate to a circuit and a method of forming the circuit.

BACKGROUND

In space and satellite (S&S) applications, the robustness of integrated circuits (ICs) is one of the most important design considerations. This is because ICs embodied in electronics systems for S&S applications are subjected to various possible radiation effects which potentially jeopardize the functionality of ICs and, at worst, cause permanent and irreparable damages to the ICs. The possible radiation effects include Total Dose Ionizing (TID) and single-event-effects (SEEs). The former TID is an accumulative effect when ICs are exposed in irradiation environments (over time), possibly changing the transistor characteristics in the ICs. However, in advanced nano-scaled fabrication processes (e.g., <90 nm feature size), the TID effect is insignificant. Conversely, the latter SEEs are errors induced when radiation particles strike the ICs. One of the SEEs is single-event-transient (SET), where a single event (e.g., a radiation particle) striking at a transistor node induces electrical charges that create a transient pulse on the transistor node. The transient pulse could be detrimental to the functionality of the IC. For example, in digital circuits, the transient pulse can result in a single-event-upset (SEU) by flipping the logic state in sequential logic, causing an error. In analog circuits, the transient pulse can disturb their operation. In both analog and digital circuits, the transient pulse may undesirably trigger the latch-up conditions, causing a single-event-latch-up (SEL). The occurrence of SET/SEU/SEL in ICs is expected to be high when advanced nano-scaled fabrication processes (e.g., <90 nm feature size) are used and/or under severe irradiation environments (e.g., >30 MeV cm$^2$/mg). Hence, it is highly desirable to mitigate SETs (and hence SEUs and SELs) in order to enhance the overall robustness of ICs for S&S applications.

To mitigate SEEs, ICs can be realized to be radiation-hardened by means of dedicated IC fabrication processes, design techniques, or a combination thereof. The dedicated IC fabrication processes employed for S&S applications are exotic in the sense that these processes are not readily available and whose costs are typically highly prohibitive. On the other hand, the design techniques for radiation-hardening, also known as Radiation-Hardened-By-Design (RHBD), are increasingly popular because RHBD techniques can be incorporated into current state-of-the-art commercially-available CMOS fabrication processes.

At this juncture, the RHBD techniques to mitigate SEEs span from layout- to circuit- to architecture-levels. These RHBD techniques are briefly summarized/referenced as follows. At the layout-level, the simplistic way is to increase the critical charges on the transistor nodes by adding more capacitive loads, e.g., by increasing the diffusion areas or increasing the transistor sizing or by adding capacitance. Other techniques include careful layout techniques such as well separation. These layout-level techniques, however, are ineffective especially where irradiation particles carry higher energy per unit distance (e.g., in high radiation environments such as in geosynchronous earth orbit (GEOs) or the South Atlantic Anomaly (SAA)). At the circuit-level, the common RHBD practices include pulse filtering technique, increased RC (resistance-capacitance) delay on the critical nodes, feedback techniques, antenna cell insertion, etc. These circuit-level RHBD practices help mitigate SETs/SEUs at the expense of slower speed, higher power dissipation and larger area overheads. At the architecture-level, the common RHBD techniques include double redundancy, Triple Modular Redundancy, and error detection and error correction techniques. As expected, these architecture-level RHBD techniques tradeoff speed/power/area for SET/SEU robustness.

There is a known layout technique, termed as Layout Design through Error-Aware Transistor Positioning, or LEAP in short, to mitigate SETs for sequential cells. The basic mechanism of how an SET is created is first briefly described, followed by the delineation of the known LEAP technique.

FIG. 1A shows a schematic diagram of an inverter 180 having a PMOS (p-type metal-oxide-semiconductor) transistor 182 and an NMOS (n-type metal-oxide-semiconductor) transistor 184, where the PMOS transistor 182 is Off, and the drain (D) of the PMOS transistor 182 is struck by a radiation particle 186. FIG. 1B depicts the cross-sectional view of the inverter 180 where the radiation particle 186 strikes at the p+ region 188 (drain (D) of the PMOS 182). During the strike, electron-hole pairs are induced but the electrons are quickly absorbed in the already hole-rich p+ region 188, leaving the induced holes in the p+ region 188. As a result, as depicted in FIG. 1C, the output Q will switch from logic '0' to logic '1' temporarily, creating a positive SET pulse 192. The SET pulse 192 will gradually disappear after the induced holes are finally absorbed. Further, although the drains (D) (p+ region 188 and n+ region 190) of the NMOS and PMOS transistors 182, 184 are connected together, if the irradiation particle 186 only strikes at the NMOS transistor 184 which is On, it is logically inconsequential as a very small negative pulse will only be created; the negative pulse will enhance the logic state of '0'.

FIG. 2A similarly depicts a schematic diagram of an inverter 280 having a PMOS transistor 282 and an NMOS transistor 284, where the NMOS transistor 284 is now Off, and the drain (D) of the NMOS transistor 284 is struck by a radiation particle 286. FIG. 2B depicts the cross-sectional view of the inverter 280 where the radiation particle 286 strikes at the n+ region 290 (drain (D) of the NMOS 284). During the strike, electron-hole pairs are induced but the holes are quickly absorbed in the already electron-rich n+ region 290, leaving the induced electrons in the n+ region 290. As a result, as depicted in FIG. 2C, the output Q will switch from logic '1' to logic '0' temporarily, creating a negative SET pulse 292. The SET pulse 292 will gradually disappear after the induced electrons are finally absorbed. Further, although the drains (D) (p+ region 288 and n+ region 290) of the NMOS and PMOS transistors 282, 284 are connected together, if the radiation particle 286 only strikes at the PMOS transistor 282 which is On, it is logically inconsequential as a very small positive pulse will only be created; the positive pulse will enhance the logic state of '1'.

The known LEAP technique leverages on the layout technique that if the drains of the PMOS and NMOS transistors are connected together, then the PMOS and NMOS transistors can be strategically placed closed together, forming a protected strike direction such that a radiation particle could likely strike at both the NMOS and PMOS transistors simultaneously (or almost simultaneously) in that direction. As a result, the positive SET pulse induced in the PMOS transistor and the negative SET pulse induced in the NMOS transistor will be largely neutralized, hence significantly reducing the magnitude of the overall SET pulse. FIG. 3A depicts this situation, as illustrated in a schematic diagram of an inverter 380, where both the PMOS transistor 382 and the NMOS transistor 384 are struck almost simultaneously by a radiation particle 386, e.g., at the drains (D) of the NMOS and PMOS transistors 382, 384. FIG. 3B depicts a possible scenario, as illustrated in a cross-sectional view of the inverter 380, showing how an irradiation particle 386 could strike at both NMOS and PMOS transistors 382, 384. The particle 386 may strike at the n+ region 390 (drain (D) of the NMOS 384) and the p+ region 388 (drain (D) of the PMOS 382). FIG. 3C depicts, as illustrated in a schematic top partial view of the inverter 380, the concept where the horizontal direction (e.g., solid line direction 396) is considered as the protected strike direction where both the NMOS and PMOS transistors 382, 384 are likely struck simultaneously in that direction. As may be appreciated, the NMOS and PMOS transistors 382, 384 are horizontally aligned to one another. Also shown in FIG. 3C are the gate regions 392, 394 of the NMOS and PMOS transistors 382, 384. The term "Poly" refers to polysilicon, the material used for the gate regions 392, 394, while the term "Diffusion" refers to a diffusion area, e.g., p+ diffusion area 388, and n+ diffusion area 390.

The LEAP technique is useful for sequential logic, e.g., cross-couple latch and Dual Inter-locked Storage Cell (DICE) latch. For example, the NMOS and PMOS transistors within the DICE latch are alternately placed close together, assuming that only a limited striking direction would induce SETs whereas such striking direction would be protected in their PMOS-NMOS pair layout arrangement.

Nonetheless, one of the major limitations of the LEAP technique is its limited protected strike direction as illustrated by the dotted lines 397a, 397b in FIG. 3C, and the LEAP technique only works well for DICE latches but not for other gates. From FIG. 3C, it may be observed that the protection angle is highly limited (as enclosed within the dotted lines 397a, 397b), unlikely to be more than 45° angle, where this angle depends on the sizing of the PMOS and NMOS transistors and their layout placement. There is therefore constrained imposed by the layout in the LEAP technique.

In view of the limitation of the LEAP technique for general circuits, there is therefore need for an RHBD technique to increase the protected strike directions (i.e., a larger protection angle), hence enhancing the robustness of the ICs against SETs (and SEUs).

SUMMARY

The invention is defined in the independent claims. Further embodiments of the invention are defined in the dependent claims.

According to an embodiment, a circuit is provided. The circuit may include a first electrical device having a first region of a first conductivity type, and a second electrical device having a second region of a second conductivity type, wherein the first region and the second region are electrically coupled to each other, and wherein one of the first and second regions is arranged to at least substantially surround the other of the first and second regions.

According to an embodiment, a method of forming a circuit is provided. The method may include forming a first electrical device having a first region of a first conductivity type, forming a second electrical device having a second region of a second conductivity type, and electrically coupling the first region and the second region to each other, wherein one of the first and second regions is arranged to at least substantially surround the other of the first and second regions.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 1B shows the corresponding cross-sectional view where the PMOS transistor is struck, while

FIG. 2B shows the corresponding cross-sectional view where the NMOS transistor is struck, while

FIG. 3B shows the corresponding cross-sectional view for a scenario where the NMOS and MNOS transistors are struck by particles, while

FIGS. 5A to 5C show schematic diagrams of a circuit, according to various embodiments.

DETAILED DESCRIPTION

Figure 1A:
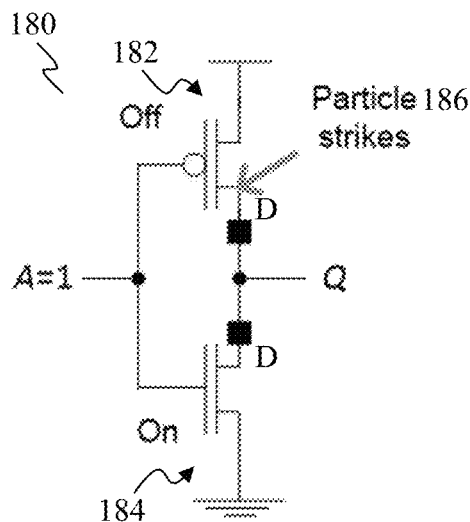
FIG. 1A shows a schematic diagram of an inverter whose PMOS transistor is Off and is struck by a radiation particle.
Figure 1B:
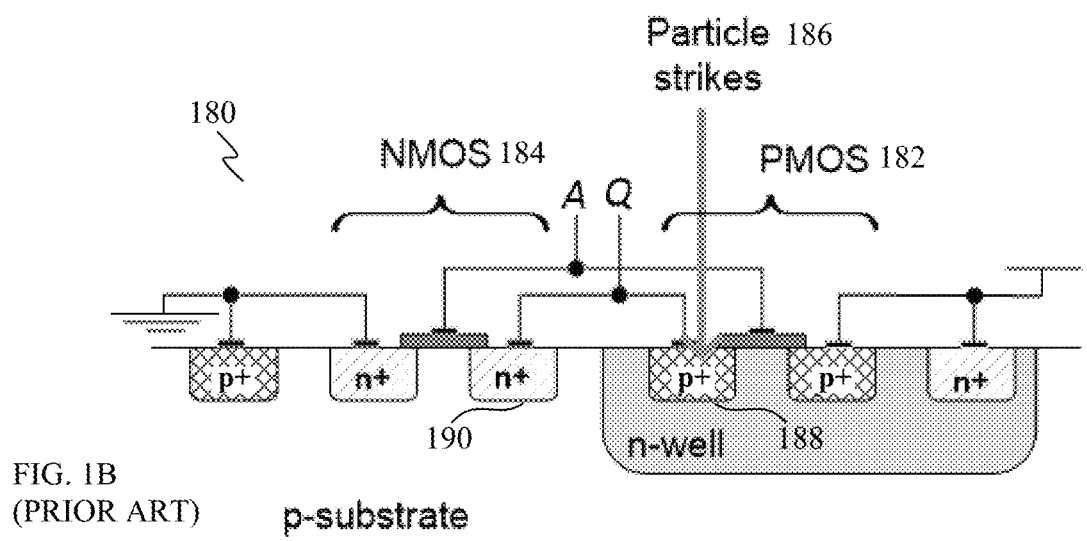
Figure 1C:
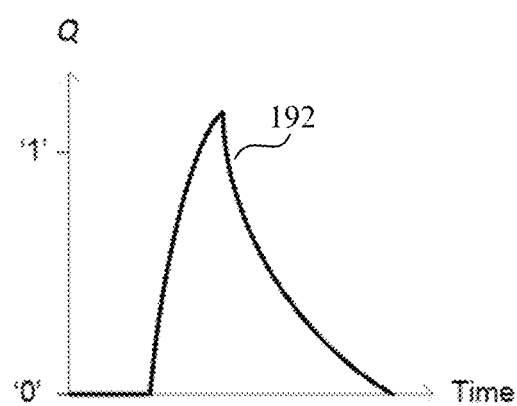
FIG. 1C shows a positive SET that is created.
Figure 2A:
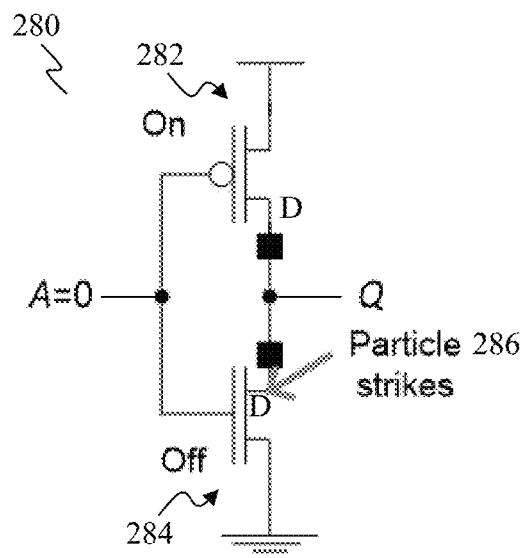
FIG. 2A shows a schematic diagram of an inverter whose NMOS transistor is Off and is struck by a radiation particle.
Figure 2B:
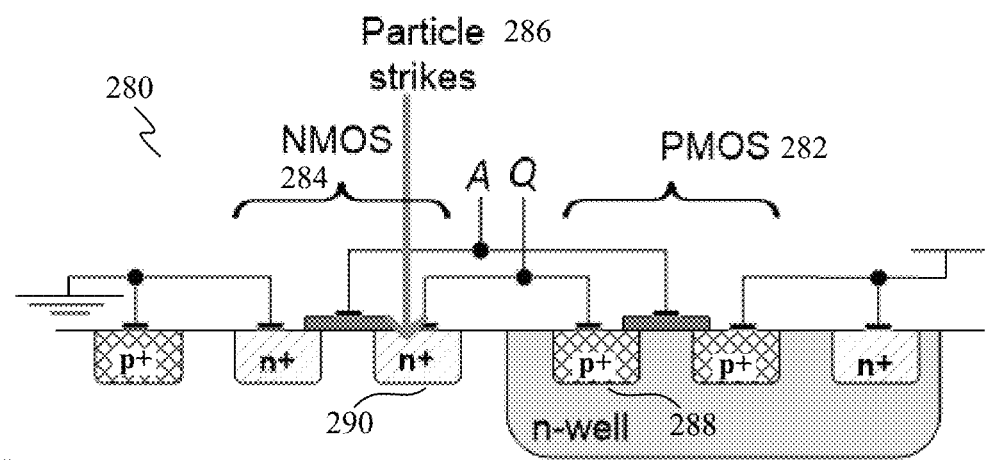
Figure 2C:
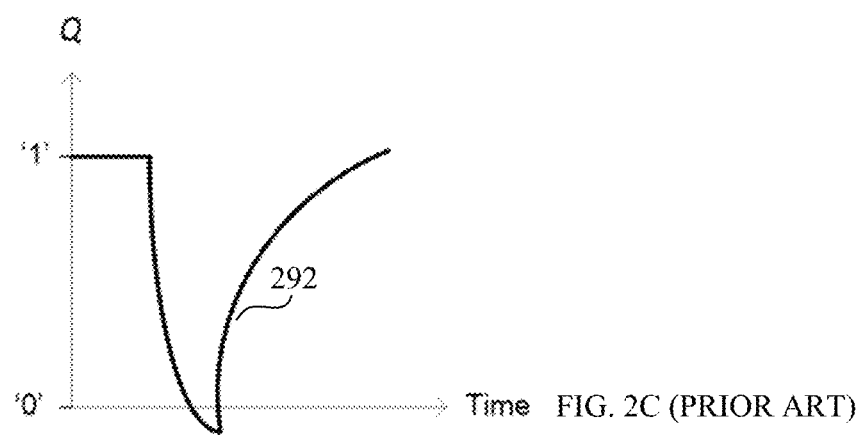
FIG. 2C shows a negative SET that is created.
Figure 3A:
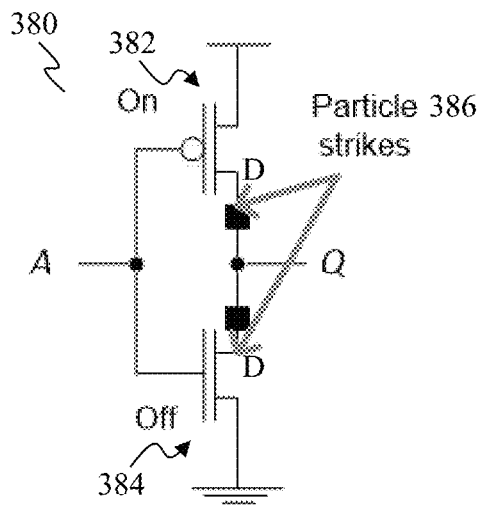
FIG. 3A shows a schematic diagram of an inverter whose PMOS and NMOS transistors are struck by particles.
Figure 3B:
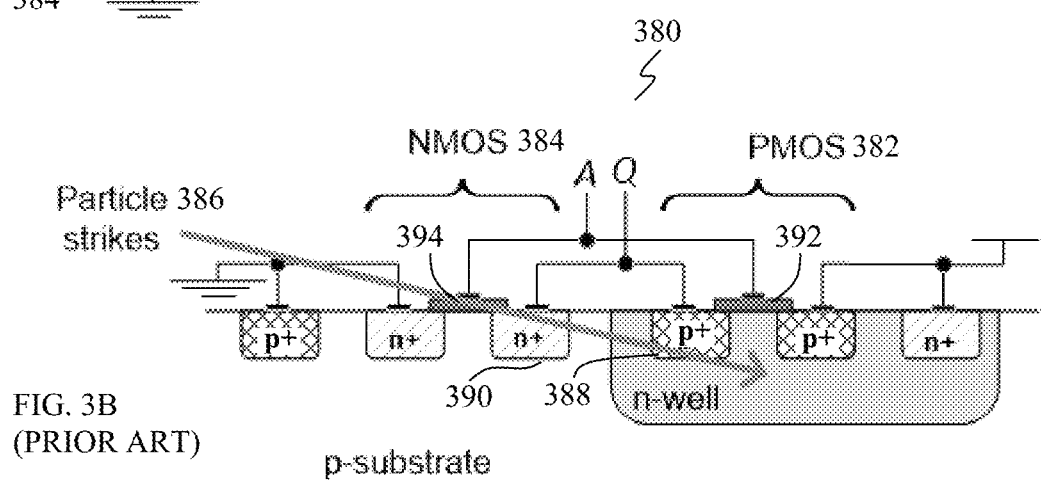
Figure 3C:
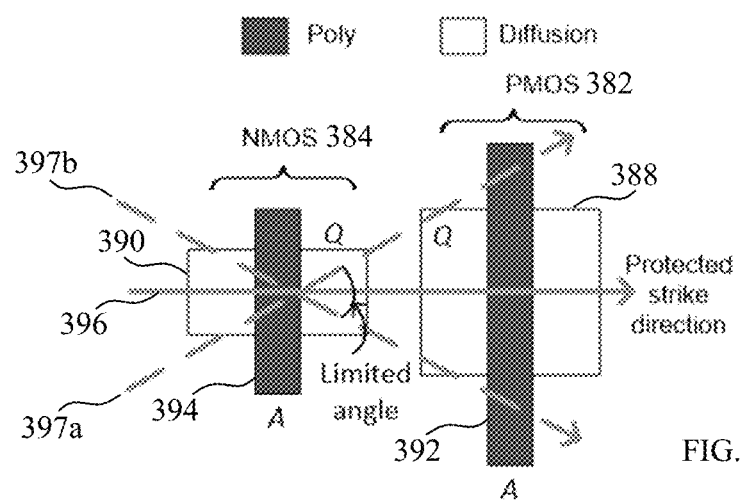
FIG. 3C shows a horizon transistor alignment to reduce SET.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements. In the context of various embodiments, the phrase "at least substantially" may include "exactly" and a reasonable variance. In the context of various embodiments, the term "about" as applied to a numeric value encompasses the exact value and a reasonable variance. As used herein, the term "and/or" includes any and all combinations of one or more of the associated listed items. As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide a device-cum-layout technique to mitigate single event effects (SEEs). Various embodiments may relate to a device-cum-layout technique applied to an integrated circuit (IC) in order to protect the IC against soft errors, for example, single-event-effects (SEEs) including single-event-transients (SETs), single-event-upsets (SEUs) and single-event-latch-ups (SELs). The technique may include providing a protective device which is laid-out and strategically placed to surround a transistor (which needs to be protected) within the IC. When both the protective device and the transistor are simultaneously (or almost simultaneously) struck by a single event (or multiple events), the electrical charges induced in the transistor may be neutralized by the opposite charges induced in the protective device. As a result, the magnitude of the pulse due to the single event (or the multiple events) may be minimised or may become negligible, hence minimising or preventing soft errors.

Various embodiments may pertain to Radiation-Hardened-By-Design (RHBD) techniques to mitigate SETs (and SEUs and SELs) in ICs for space and satellite (S&S) applications.

Figure 4A:
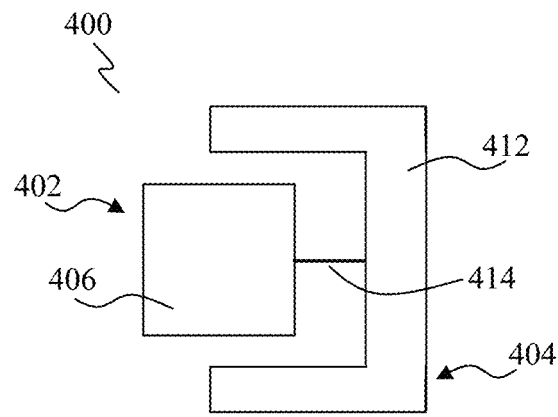
FIGS. 4A and 4C shows a schematic diagrams of circuits, according to various embodiments.

FIG. 4A shows a schematic diagram of a circuit 400, according to various embodiments. The circuit 400 includes a first electrical device 402 having a first region 406 of a first conductivity type, and a second electrical device 404 having a second region 412 of a second conductivity type, wherein the first region 406 and the second region 412 are electrically coupled (as represented by the line 414) to each other, and wherein one of the first and second regions 406, 412 is arranged to at least substantially surround the other of the first and second regions 406, 412. FIG. 4A shows a non-limiting example where the second region 412 is arranged to at least substantially surround the first region 406. The view as illustrated in FIG. 4A may be the top view and/or the side view and/or the cross-sectional view of the circuit 400.

In other words, a circuit 400 with a pair of electrical devices 402, 404 may be provided. The first and second electrical devices 402, 404 may include respectively a first region (or area) 406 and a second region (or area) 412 that may be of different conductivity types. The first region 406 may be a region provided or doped or diffused with elements or dopants of a first conductivity type. This may mean that the first region 406 may be a first diffusion region or area. The second region 412 may be a region provided or doped or diffused with elements or dopants of a second conductivity type. This may mean that the second region 412 may be a second diffusion region or area. The first conductivity type and the second conductivity type may be opposite conductivity types or opposite polarities. The first region 406 and the second region 412 may be arranged spaced apart from each other.

The first region 406 and the second region 412 may be electrically coupled to each other to enable electrical communication therebetween. Electrical signals or electrical charges may flow between the first region 406 and the second region 412.

In various embodiments, the first region 406 and the second region 412 may be electrically coupled to each other by means of a connecting member 414. As a non-limiting example, the connecting member 414 may be a physical wire, which may be metallic. Additionally or alternatively, the connecting member 414 may be a (charged) conduction channel formed in the substrate (meaning in the material of the substrate) of the first electrical device 402 and the second electrical device 404 so as to (electrically) bridge the first region 406 and the second region 412 to allow flow of charges through the conduction channel. The conduction channel may be already "in-built" with the substrate, and/or formed when the first region 406 and the second region 412 create the conduction channel under irradiation. That means that radiation particles (e.g., heavy-ions, protons, neutrons, etc.) may strike at one of the first region 406 and the second region 412, inducing a channel that bridges the first region 406 and the second region 412. It should be appreciated that description herein in the context of the connecting member 414 may be applicable to electrical coupling between any two or more regions in various embodiments.

One of the first and second regions 406, 412 may be arranged to at least substantially surround (e.g., laterally and/or vertically) the other of the first and second regions 406, 412. As a non-limiting example, the second region 412 may be arranged to at least substantially surround the first region 406.

For one region (either the first region 406 or the second region 412) to at least substantially surround the other region (either the second region 412 or the first region 406), the one region may extend in the direction or along two or more of the following dimensions of the other region: length, width and thickness. The thickness may be defined in the direction into the substrate of the corresponding electrical device (either the first electrical device 402 or the second electrical device 404).

As a result of the surrounding arrangement of the first and second regions 406, 412, one (same) or more particles (e.g., radiation particle(s)) may strike or hit both the first region 406 and the second region 412. The particle(s) may strike both the first region 406 and the second region 412 at least substantially simultaneously and/or successively. The particle(s) may originate from a source external to the circuit

400. As non-limiting examples, the particle(s) may include heavy-ion(s), proton(s), neutron(s), etc.

A particle strike on each of the first region 406 and the second region 412 may cause or generate an electrical effect or event at the first region 406 and the second region 412. This may result in the generation of electrical charges or electrical pulses at the first region 406 and the second region 412. Such electrical charges or electrical pulses may be transient. By having the first region 406 and the second region 412 electrically coupled to each other, the electrical charges that may be generated respectively at the first region 406 and the second region 412 (e.g., as a result of particle strike) may at least substantially cancel each other or be neutralised by each other. For example, the resulting positive charges from one of the first and second regions 406, 412, and the resulting negative charges from the other of the first and second regions 406, 412 may neutralise each other. Accordingly, protection may be afforded to the electrical device that is to be protected against the electrical effect or event generated at such electrical device, which otherwise might be adversely affected or damaged as a result of the occurrence of the electrical effect.

As a result of the surrounding arrangement of the first and second regions 406, 412, an extended angle for protected strike directions may be provided. The "protected strike direction" may mean the direction of the particle in which the particle may strike both the first and second regions 406, 412 (at least substantially simultaneously). Therefore, there may be an increased probability of protection as a result of the larger protection angle.

Depending on the configuration or arrangement of the first and second regions 406, 412, one of the first and second electrical devices 402, 404 may act as a protective device for the other of the first and second electrical devices 402, 404. As a non-limiting example, the second region 412 may be arranged to at least substantially surround the first region 406, and the second electrical device 404 may act as a protective device for the first electrical device 402.

The protective device may be an independent device in the sense that the protective device does not take part in the functional performance of the device that is to be protected. In other words, the device that is to be protected may be functionally independent of/from the protective device. This may mean that the device that is to be protected may still perform its function that it is intended or designed to perform, even without the protective device which is provided to offer protection against adverse electrical effect or event (e.g., due to particle strike) that may occur at the device that is to be protected. Further, the function of the combination of the protective device and the device that is to be protected may potentially not be different from the function that the device that is to be protected itself may perform. By having the protective device as an independent device, there is enhanced flexibility in the design or layout of circuits.

In various embodiments, the first electrical device 402 may include one or more other regions, apart from the first region 406, and/or the second electrical device 404 may include one or more other regions, apart from the second region 412.

In various embodiments, at least one of the first region 406 or the second region 412 may have a corresponding surface (e.g., top surface) that is exposed.

In various embodiments, the first electrical device 402 and the second electrical device 404 may be formed or defined on or using the same substrate (e.g., a semiconductor substrate).

In various embodiments, the one of the first and second regions 406, 412 may be arranged to at least substantially surround the other of the first and second regions 406, 412 over an angle of about 180° or more (i.e., ≥180°). The angle may also be referred to as the protected strike angle. Accordingly, any strike direction by a particle (e.g., a radiation particle) that may be within the coverage afforded by such a wide angle may be a protected strike direction. This means that the particle is likely to strike both the first and second regions 406, 412 such that any electrical effect or event resulting therefrom may be neutralized. Further, taking symmetry into consideration, such an arrangement may effectively provide a full (protected strike) angle of 360°. This may mean that protection may be afforded irrespective of whether a particle (e.g., a radiation particle) strikes the first region 406 or the second region 412 initially before striking the other of the first and second regions 406, 412.

In various embodiments, for providing the angle of ≥180°, one of the first and second regions 406, 412 may extend to cover or overlap with two or more of the entire length, the entire width and the entire thickness of the other of the first and second regions 406, 412. The one region may extend to cover or overlap with the entire length of the other region that is exposed or the entire width of the other region that is exposed.

Figure 4C:
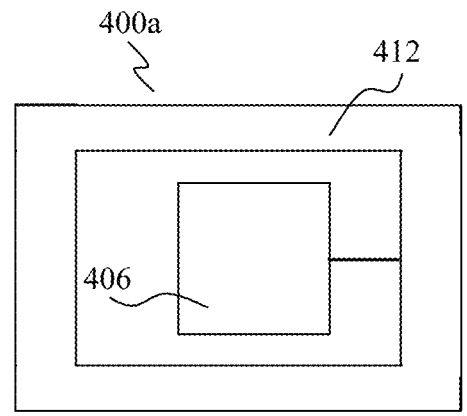

In various embodiments, the one of the first and second regions 406, 412 may be arranged to entirely surround the other of the first and second regions 406, 412, as shown in FIG. 4C for the circuit 400a. This may provide a 360° angle for protected strike directions.

In various embodiments, the first and second regions 406, 412 may have shapes that are complementary to each other.

In various embodiments, the first electrical device 402 may be or may include a transistor (e.g., a metal-oxide-semiconductor field-effect transistor (MOSFET)), and the first region 406 may be or may include a source/drain (S/D) region. The second electrical device 404 may be the protective device, and the first electrical device 402 may be the device to be protected by the protective device.

In the context of various embodiments, the "source/drain region" (which may also be known as the "source/drain terminal") of a transistor may refer to a source (S) region (or terminal) or a drain (D) region (or terminal). As the source region and the drain region of a transistor are generally fabricated such that these regions are geometrically symmetrical, these regions may be collectively referred to as source/drain (S/D) regions. In various embodiments, a particular source/drain region may be a "source" region or a "drain" region depending on the voltage to be applied to that region.

In various embodiments, the transistor (being part of the first electrical device 402) may be or may include a PMOS transistor (e.g., p-channel MOSFET), the first conductivity type may be a p-type conductivity, the second conductivity type may be an n-type conductivity, and the second region 412 may be arranged to at least substantially surround the first region 406. This means that the source/drain region (being part of the first region 406) of the transistor may be of a p-type conductivity and the second region 412 may be of an n-type conductivity. For example, the source/drain region may be a p+ region. The source/drain region may mean the drain region.

In various embodiments, the transistor (being part of the first electrical device 402) may be or may include an NMOS transistor (e.g., n-channel MOSFET), the first conductivity type may be an n-type conductivity, the second conductivity type may be a p-type conductivity, and the second region 412 may be arranged to at least substantially surround the first region 406. This means that the source/drain region (being part of the first region 406) of the transistor may be of an n-type conductivity and the second region 412 may be of a p-type conductivity. For example, the source/drain region may be an n+ region. The source/drain region may mean the drain region.

In the context of various embodiments, the term "p-type" may mean a host material (e.g., semiconductor) that is doped with doping atoms that may accept weakly-bound outer electrons from the host material, thereby creating vacancies left behind by the electrons, known as holes, thereby resulting in an electrically conductive p-type host material with an excess number of mobile holes (positively charged carriers). Such doping atoms are also generally referred to as acceptors or acceptor atoms.

In the context of various embodiments, the term "p+ region" or the like means a region that is doped with a relatively high amount of acceptor dopants, where the excess mobile hole concentrations are very large.

In the context of various embodiments, the term "n-type" may mean a host material (e.g., semiconductor) that is doped with doping atoms that may provide extra conduction electrons to the host material, thereby resulting in an electrically conductive n-doped host material with an excess number of mobile electrons (negatively charged carriers). Such doping atoms are also generally referred to as donors or donor atoms.

In the context of various embodiments, the term "n+ region" or the like means a region that is doped with a relatively high amount of donor dopants, where the excess mobile electron concentrations are very large.

In various embodiments, the second electrical device 404 may be or may include an NMOS transistor, and the second region 412 may be or may include a source/drain region. This may mean that the source/drain region of the NMOS transistor may be of an n-type conductivity. For example, the source/drain region of the NMOS transistor may be an n+ region. The source/drain region may mean the drain region.

In various embodiments, the second electrical device 404 may be or may include a PMOS transistor, and the second region 412 may be or may include a source/drain region. This may mean that the source/drain region of the PMOS transistor may be of a p-type conductivity. For example, the source/drain region of the PMOS transistor may be a p+ region. The source/drain region may mean the drain region.

As described, there may be a pair of PMOS-NMOS transistors, with one of the transistors being the protective device and the other of the transistors being the device to be protected by the protective device. The respective source/drain regions (e.g., drain regions) of the pair of PMOS-NMOS transistors may be electrically coupled to each other.

In various embodiments, the second electrical device 404 may be or may include a diode (e.g., a pn diode, a pin diode, etc.). Where the second region 412 of the diode is of an n-type conductivity, the second region 412 may mean the cathode region of the diode. Where the second region 412 of the diode is of a p-type conductivity, the second region 412 may mean the anode region of the diode.

In various embodiments, the circuit 400 may further include a third electrical device having a third region of the second conductivity type, and a fourth electrical device having a fourth region of the first conductivity type, wherein the third region and the fourth region may be electrically coupled to each other, and wherein one of the third and fourth regions may be arranged to at least substantially surround (e.g., laterally and/or vertically) the other of the third and fourth regions. As an example, the fourth region may be arranged to at least substantially surround the third region.

The third region may be a region provided or doped or diffused with elements or dopants of the second conductivity type. This may mean that the third region may be a third diffusion region or area. The fourth region may be a region provided or doped or diffused with elements or dopants of the first conductivity type. This may mean that the fourth region may be a fourth diffusion region or area.

Depending on the configuration or arrangement of the third and fourth regions, one of the third and fourth electrical devices may act as a protective device for the other of the third and fourth electrical devices. As a non-limiting example, the fourth region may be arranged to at least substantially surround the third region, and the fourth electrical device may act as a protective device for the third electrical device.

In various embodiments, the first and second electrical devices 402, 404, and the third and fourth electrical devices may be formed or defined on or using the same substrate (e.g., a semiconductor substrate).

It should be appreciated that description in the context of the first and second electrical devices 402, 404 may correspondingly be applicable also to the third and fourth electrical devices.

The one of the third and fourth regions may be arranged to at least substantially surround the other of the third and fourth regions over an angle of about 180° or more.

The one of the third and fourth regions may be arranged to entirely surround the other of the third and fourth regions.

The third and fourth regions may have shapes that are complementary to each other.

In various embodiments, the first region and the third region may be electrically coupled to each other.

In various embodiments, the third electrical device may be or may include a transistor (e.g., a MOSFET), the third region may be or may include a source/drain region (e.g., a drain region), and the fourth region may be arranged to at least substantially surround the third region. The third electrical device may be an NMOS transistor or a PMOS transistor. In embodiments where the first electrical device 402 may be an NMOS transistor, the third electrical device may be a PMOS transistor. In embodiments where the first electrical device 402 may be a PMOS transistor, the third electrical device may be an NMOS transistor.

In various embodiments, the fourth electrical device may be or may include a transistor (e.g., a MOSFET), and the fourth region may be or may include a source/drain region (e.g., a drain region). The fourth electrical device may be an NMOS transistor or a PMOS transistor. In embodiments where the third electrical device may be an NMOS transistor, the fourth electrical device may be a PMOS transistor. In embodiments where the third electrical device may be a PMOS transistor, the fourth electrical device may be an NMOS transistor.

In various embodiments, the fourth electrical device may be or may include a diode (e.g., a pn diode, a pin diode, etc.).

In various embodiments, the first electrical device 402 and the third electrical device may form or define an inverter. As non-limiting examples, each of the first electrical device 402 and the third electrical devices may be or may include a transistor, where the two transistors define the inverter. One of the electrical devices may be or may include an NMOS transistor, while the other of the electrical devices may be or may include a PMOS transistor.

In various embodiments, the circuit 400 may further include a third electrical device having a third region of the first conductivity type, wherein the first region 406, the second region 412 and the third region may be electrically coupled to each other, and wherein the second region 412 may be arranged to at least substantially surround (e.g., laterally and/or vertically) the first region 406 and the third region. The third region may be a region provided or doped or diffused with elements or dopants of the first conductivity type. The second region 412 may be arranged to at least substantially surround the first region 406 and the third region individually. The first electrical device 402 and the third electrical device may be connected in series. As non-limiting examples, each of the first electrical device 402 and the third electrical device may be a transistor (e.g., a MOSFET). The transistors may be of the same type, e.g., PMOS transistors or NMOS transistors. The first region 406 may be a first source/drain (S/D) region, and the third region may be a third source/drain (S/D) region. One of the first source/drain region and the third source/drain region may be a drain (D) region, while the other of the first source/drain region and the third source/drain region may be a source (S) region.

While it has been described in various non-limiting examples that a region of a conductivity type of a protective device may at least substantially surround the drain (D) region of another conductivity type of a transistor that is to be protected, the region of the protective device may alternatively at least substantially surround the source (S) region of the other conductivity type of the transistor.

In the context of various embodiments, a transistor may include a first source/drain (S/D) region, a second source/drain (S/D) region, and a gate (G) region. One of the first and second source/drain regions may be a source (S) region while the other of the first and second source/drain regions may be a drain (D) region. The first and second source/drain regions may be of the same conductivity type. The gate (G) region may be connected or electrically coupled to the first and second source/drain regions.

Figure 4B:
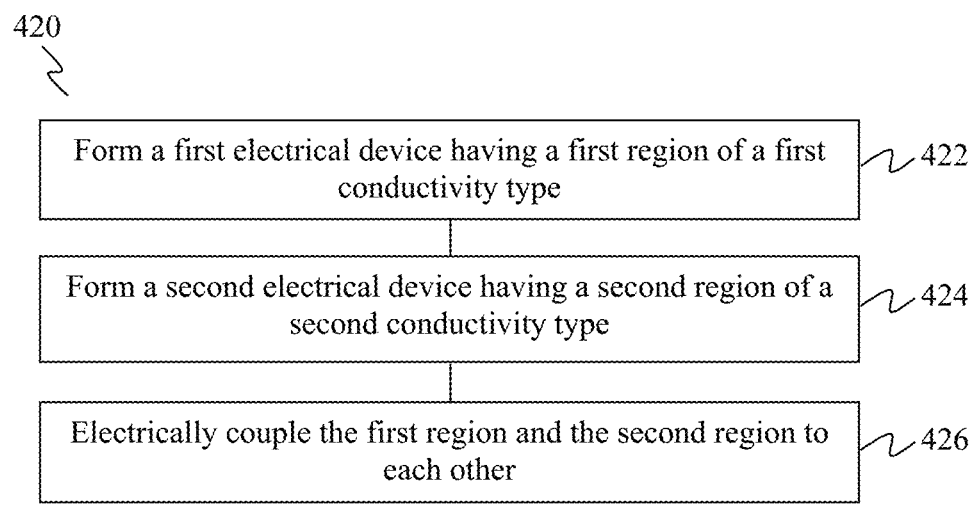
FIG. 4B shows a flow chart illustrating a method of forming a circuit, according to various embodiments.

FIG. 4B shows a flow chart 420 illustrating a method of forming a circuit, according to various embodiments.

At 422, a first electrical device having a first region of a first conductivity type is formed.

At 424, a second electrical device having a second region of a second conductivity type is formed.

At 426, the first region and the second region are electrically coupled to each other.

One of the first and second regions is arranged to at least substantially surround the other of the first and second regions. This may be formed at 422 or 424.

The first and second electrical devices may be formed on the same substrate.

In various embodiments, the one of the first and second regions may be arranged to at least substantially surround the other of the first and second regions over an angle of about 180° or more.

In various embodiments, the one of the first and second regions may be arranged to entirely surround the other of the first and second regions.

The method may further include forming a third electrical device having a third region of the second conductivity type, forming a fourth electrical device having a fourth region of the first conductivity type, and electrically coupling the third region and the fourth region to each other, wherein one of the third and fourth regions may be arranged to at least substantially surround the other of the third and fourth regions.

The first, second, third and fourth electrical devices may be formed on the same substrate.

In various embodiments, the one of the third and fourth regions may be arranged to at least substantially surround the other of the third and fourth regions over an angle of about 180° or more.

In various embodiments, the one of the third and fourth regions may be arranged to entirely surround the other of the third and fourth regions.

In various embodiments, the method may further include electrically coupling the first region and the third region to each other.

It should be appreciated that descriptions in the context of the circuit 400 may correspondingly be applicable in relation to the method for forming a circuit described in the context of the flow chart 420.

Various embodiments may pertain to a device-cum-layout RHBD technique to extend the protected strike directions to mitigate SETs/SEUs in ICs. These may be constituted in the form of the following non-limiting examples.

Various embodiments may provide a device-cum-layout RHBD technique in a circuit having a transistor and a device, wherein the transistor has a drain diffusion area with a first polarity (or first conductivity type), wherein the device has a diffusion area with a second polarity (or second conductivity type), the second polarity in the diffusion area of the device is opposite to the first polarity in the diffusion area of the transistor, the diffusion area of the device being connected to the drain (or drain diffusion area) of the transistor, and the diffusion area of the device may be strategically laid out to (partially or fully) surround the drain diffusion area of the transistor.

Various embodiments may provide a device-cum-layout RHBD technique in a circuit having a transistor and a device, wherein the transistor is an NMOS transistor having an n+ drain diffusion area, wherein the device has a p+ diffusion area, the p+ diffusion area being connected to the n+ drain diffusion area of the NMOS transistor, and the p+ diffusion area of the device may be strategically laid out to (partially or fully) surround the n+ drain diffusion area of the NMOS transistor.

Various embodiments may provide a device-cum-layout RHBD technique in a circuit having a transistor and a device, wherein the transistor is a PMOS transistor having a p+ drain diffusion area, wherein the device has an n+ diffusion area, the n+ diffusion area being connected to the p+ drain diffusion area of the PMOS transistor, and the n+ diffusion area of the device may be strategically laid out to (partially or fully) surround the p+ drain diffusion area of the PMOS transistor.

Various embodiments may provide a device-cum-layout RHBD technique in a circuit having a transistor and a device, wherein the transistor is an NMOS transistor having an n+ drain diffusion area, wherein the device is a diode having a p+ diffusion area, the anode (p+ diffusion area) of the diode (device) being connected to the n+ drain diffusion area of the NMOS transistor, and the p+ diffusion area of the diode (device) may be strategically laid out to (partially or fully) surround the n+ drain diffusion area of the NMOS transistor.

Various embodiments may provide a device-cum-layout RHBD technique in a circuit having a transistor and a device, wherein the transistor is a PMOS transistor having a p+ drain diffusion area, wherein the device is a diode having an n+ diffusion area, the cathode (n+ diffusion area) of the diode (device) being connected to the p+ drain diffusion area of the PMOS transistor, and the n+ diffusion area of the diode (device) may be strategically laid out to (partially or fully) surround the p+ drain diffusion area of the PMOS transistor.

Various embodiments may provide a device-cum-layout RHBD technique in a circuit having a transistor and a device, wherein the transistor is an NMOS transistor having an n+ drain diffusion area, wherein the device is a protective PMOS transistor having a p+ drain diffusion area, the p+ drain diffusion area of the protective PMOS transistor (device) being connected to the n+ drain diffusion area of the NMOS transistor, and the p+ diffusion area of the protective PMOS transistor may be strategically laid out to (partially or fully) surround the n+ drain diffusion area of the NMOS transistor.

Various embodiments may provide a device-cum-layout RHBD technique in a circuit having a transistor and a device, wherein the transistor is a PMOS transistor having a p+ drain diffusion area, wherein the device is a protective NMOS transistor having an n+ drain diffusion area, the n+ drain diffusion area of the protective NMOS transistor (device) being connected to the p+ drain diffusion area of the PMOS transistor, and the n+ diffusion area of the protective NMOS transistor may be strategically laid out to (partially or fully) surround the p+ drain diffusion area of the PMOS transistor.

Various embodiments may provide one or more of the following as compared to known methods. Various embodiments may, therefore, provide robust operation to mitigate SETs/SEUs.

(i) Various embodiments may increase the protected strike direction against SETs/SEUs. For example, a 180° protected angle may be achieved as opposed to a limited angle (e.g., 45°) in the known technique. Taking the symmetrical directions into account, a 180° protected angle may mean all directions.

(ii) In various embodiments, the (protective) device is an additive and independent device. The device may be placed adjacent to or very close to the transistor that is to be protected. This is unlike the known LEAP technique which assumes that both PMOS and NMOS transistors need to be connected, where their placement positions are limited due to their already fixed transistor configurations.

(iii) In various embodiments, the (protective) device may be designed to protect any transistors (PMOS or NMOS). This is unlike the known LEAP technique where the NMOS-PMOS pair must exist and the striking protection angle is fixed.

(iv) Various embodiments may be easily applied to any gate whereas the known LEAP is only applicable to DICE latches.

(v) In various embodiments, the diffusion area of the (protective) device is flexible and may be adjusted; the sizing of the diffusion area may affect the hit rate of the irradiation particles. This is unlike the known LEAP technique whereby because the transistor sizing of the PMOS and NMOS transistors is fixed, their diffusion areas are somewhat fixed.

Non-limiting examples of the device-cum-layout technique of various embodiments will now be described with reference to FIGS. 5A to 5C, 6A, 6B, 6C and 7.

FIGS. 5A to 5C show schematic diagrams of a circuit, according to various embodiments. FIG. 5A shows a simplified layout view of a circuit 500a to illustrate the approach of various embodiments to protect an electrical device (e.g., a transistor) 502a from SETs/SEUs. The view illustrated in FIG. 5A may be a top view of the circuit 500a. It should be appreciated that the circuit 500a may be part of a larger circuit arrangement, which may include other circuit(s) and device(s).

The transistor 502a may include a region 506a, a region 508a, and a gate (G) region (or terminal) 510a. As non-limiting examples, the region 506a may be a drain (D) region (or terminal), while the region 508a may be a source (S) region (or terminal). While not clearly shown, it should be appreciated that the drain (D) region 506a and the source (S) region 508a may be separate regions or spaced apart from each other. The gate (G) region 510a may be arranged overlapping with the drain (D) region 506a and the source (S) region 508a. The gate (G) region 510a may electrically induce a channel that bridges the drain (D) region 506a and the source (S) region 508a, making the drain (D) region 506a and the source (S) region 508a electrically conductive. Otherwise, the gate (G) region 510a may isolate the drain (D) region 506a and the source (S) region 508a, making the drain (D) region 506a and the source (S) region 508a inconductive.

Each of the drain (D) region 506a and the source (S) region 508a may be or may include a diffusion area or region of a first conductivity type or first polarity. Using the drain (D) region 506a as a non-limiting example, this may mean that a region of a substrate may be provided or diffused with elements or dopants of a first conductivity type so as to define the drain (D) region 506a. The gate (G) region 510a may be or may include polysilicon (Poly).

The circuit 500a may further include another device 504a, e.g., an electrical device, that may act as a protective device for the electrical device (or transistor) 502a. The devices 502a, 504a may be spaced apart from each other. The devices 502a, 504a may be formed or defined on or using the same substrate.

The device 504a may include a diffusion area or region 512a of a second conductivity type or second polarity. The diffusion area 512a may extend in the direction of or along two or more of the length, width and thickness of the first region 506a. The first and second conductivity types are opposite conductivity types. One of the first and second conductivity types may be an n-type conductivity while the other of the first and second conductivity types may be a p-type conductivity.

The devices 502a, 504a may be coupled or connected to each other, e.g., via a connecting member (e.g., a metal wire) 514a. The connecting member 514a may be electrically conductive so that the devices 502a, 504a, e.g., the drain (D) region 506a and the diffusion area 512a, may be electrically coupled to one another.

The device 504a, or the diffusion area 512a thereof, may be arranged to at least substantially surround the transistor 502a, or the region (or drain (D) region) 506a thereof. The diffusion area 512a may be provided extending beyond the length and/or width of the drain (D) region 506a. The diffusion area 512a may be arranged on at least two sides of the drain (D) region 506a. As a non-limiting example, using the configuration shown in FIG. 5A, the drain (D) region 506a may be of a shape having four sides (e.g., a rectangle) and the diffusion area 512a may be arranged on three sides of the drain (D) region 506a. This may mean that the diffusion area 512a may have corresponding sides facing the three sides of the drain (D) region 506a. Accordingly, the diffusion area 512a may at least substantially surround the drain (D) region 506a. As shown, the diffusion area 512a may be U-shaped. The drain (D) region 506a and the diffusion area 512a may be provided with shapes complementary to each other. In some embodiments, the diffusion area 512a may be arranged to entirely surround the drain (D) region 506a. It should be appreciated that the drain (D) region 506a and/or the diffusion area 512a may have any suitable shape and/or size. Further, the relative arrangement or positioning of the drain (D) region 506a and the diffusion area 512a may be suitably modified as long as the diffusion area 512a may be arranged to at least substantially surround or enclose the drain (D) region 506a.

In various embodiments, the diffusion area 512a may form part of the device 504a which may further include one or more further parts or regions (not shown), or the device 504a may consist of the diffusion area 512a, meaning that the diffusion area 512a defines the entire device 504a.

As described, the transistor 502a (to be protected) and the protective device 504a may have different diffusion conductivity types or polarities. As their diffusions are of opposite conductivity types, when a radiation particle (or many particles) strikes at both the diffusion areas 506a, 512a simultaneously (or almost simultaneously), a positive SET pulse and a negative SET pulse may be generated. As the drain (D) 506a of the transistor 502a and the protective device 504a are connected to each other, the positive and negative SET pulses may be neutralized by each other, meaning that the positive and negative SET pulses may substantially cancel each other. In other words, the resulting composite SET pulse may be insignificant.

As described herein, the diffusion area 512a of the protective device 504a may at least substantially surround the drain diffusion region 506a of the transistor 502a. As may be observed in FIG. 5A, a 180° angle may be formed from top to bottom, where the diffusion area 512a overlaps with three sides of the drain region 506a, based on the configuration in FIG. 5A. Taking the symmetrical directions into account, various embodiments may enable protection from all directions (up to 360°). Put simply, no matter which direction an irradiation particle may come from, and given that an irradiation particle may likely strike at both the drain (D) region 506a of the transistor 502a and the diffusion region 512a of the protective device 504a, any SET pulse that may be generated may be neutralized. Nevertheless, there may be a challenge in various embodiments in that where an irradiation particle hits only onto the transistor 502a, the protective device 504a may not be able to protect the transistor 502a from SETs. However, as various embodiments may provide an enlarged angle for protected strike directions, various embodiments may mitigate the effects of the majority of occurrences of radiation particle strikes.

FIG. 5B shows a simplified layout view of a circuit 500b of various embodiments to protect an electrical device (e.g., an NMOS transistor) 502b using a p+ diffusion protective device 504b. The view illustrated in FIG. 5B may be a top view of the circuit 500b. It should be appreciated that description provided herein in the context of the circuit 500a may correspondingly be applicable also to the circuit 500b.

Briefly, the NMOS transistor 502b may include a region (e.g., a drain (D) region or terminal) 506b, a region (e.g., a source (S) region or terminal) 508b, and a gate (G) region or terminal 510b. Each of the drain (D) region 506b and the source (S) region 508b may be or may include an n+ diffusion area or region, while the gate (G) region 510b may be or may include polysilicon (Poly). The protective device 504b may include a p+ diffusion area or region 512b. A connecting member (e.g., a metal wire) 514b may be provided to couple or connect the devices 502b, 504b to each other. For example, the n+ drain (D) region 506b and the p+ diffusion region 512b may be electrically coupled to one another via the connecting member 514b.

The device 504b, or the p+ diffusion area 512b thereof, may be arranged to at least substantially surround the NMOS transistor 502b, or the region (or drain (D) region) 506b thereof. For example, using the configuration shown in FIG. 5B, the p+ diffusion area 512b may be arranged on three sides of the drain (D) region 506b. As shown, the p+ diffusion area 512b may be U-shaped. Accordingly, the NMOS transistor 502b may be protected against SETs.

FIG. 5C shows a simplified layout view of a circuit 500c of various embodiments to protect an electrical device (e.g., a PMOS transistor) 502c using an n+ diffusion protective device 504c. The view illustrated in FIG. 5C may be a top view of the circuit 500c. It should be appreciated that description provided herein in the context of the circuit 500a may correspondingly be applicable also to the circuit 500c.

Briefly, the PMOS transistor 502c may include a region (e.g., a drain (D) region or terminal) 506c, a region (e.g., a source (S) region or terminal) 508c, and a gate (G) region or terminal 510c. Each of the drain (D) region 506c and the source (S) region 508c may be or may include a p+ diffusion area or region, while the gate (G) region 510c may be or may include polysilicon (Poly). The protective device 504c may include an n+ diffusion area or region 512c. A connecting member (e.g., a metal wire) 514c may be provided to couple or connect the devices 502c, 504c to each other. For example, the p+ drain (D) region 506c and the n+ diffusion region 512c may be electrically coupled to one another via the connecting member 514c.

The device 504c, or the n+ diffusion area 512c thereof, may be arranged to at least substantially surround the PMOS transistor 502c, or the first region (or drain (D) region) 506c thereof. For example, using the configuration shown in FIG. 5C, the n+ diffusion area 512c may be arranged on three sides of the drain (D) region 506c. As shown, the n+ diffusion area 512c may be U-shaped. Accordingly, the PMOS transistor 502c may be protected against SETs.

Figure 6A:
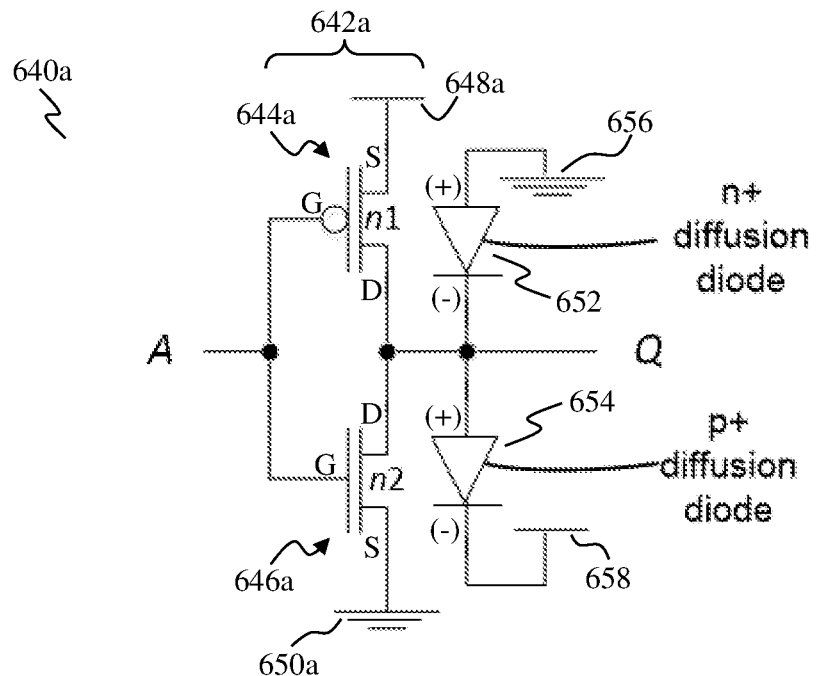
FIGS. 6A to 6C show schematic diagrams of three examples of design configurations, according to various embodiments.
Figure 6B:
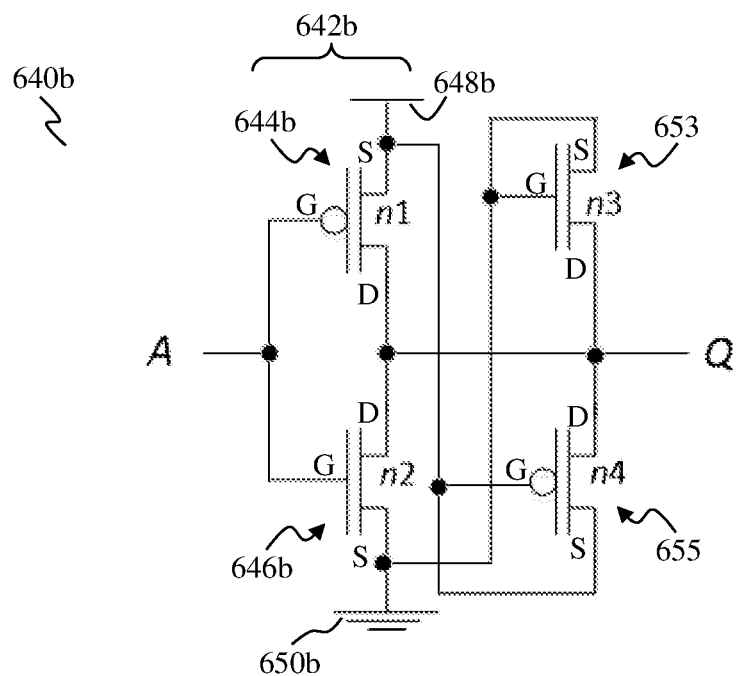

FIGS. 6A and 6B show schematic diagrams of two examples of design configurations, according to various embodiments, for protecting an inverter. FIG. 6A shows a circuit 640a including an inverter 642a having a PMOS transistor (n1) 644a and an NMOS transistor (n2) 646a. The source (S) terminal of the PMOS transistor 644a may be coupled to a power supply line 648a, while the source (S) terminal of the NMOS transistor 646a may be coupled to a ground 650a. The drain (D) terminals of the PMOS transistor 644a and the NMOS transistor 646a may be coupled to each other. The gate (G) terminals of the PMOS transistor 644a and the NMOS transistor 646a may be coupled to each other, and may receive an input A. An output Q may be generated or derived at or from the drain (D) terminals of the PMOS transistor 644a and the NMOS transistor 646a.

The circuit 640a may further include a first diode 652 and a second diode 654. The first diode 652 may be coupled between the drain (D) terminals of the transistors 644a, 646a, and a ground 656. The grounds 650a, 656 may be the same ground terminal. The second diode 654 may be coupled between the drain (D) terminals of the transistors 644a, 646a, and a power supply line 658. The power supply lines 648a, 658 may be the same supply line. As shown in FIG. 6A, the first and second diodes 652, 654 may be connected in series between the power supply line 658 and the ground 656.

In greater detail, the first diode 652 may include a cathode (−), which may be or include an n+ diffusion region, coupled to the drain (D) terminals of the transistors 644a, 646a, and an anode (+) coupled to the ground 656. The second diode 654 may include an anode (+), which may be or include a p+ diffusion region, coupled to the drain (D) terminals of the transistors 644a, 646a, and a cathode (−) coupled to the power supply line 658.

For the circuit 640a, effectively, an n+ diffusion diode 652 may be used to protect the PMOS transistor (n1) 644a, whereas a p+ diffusion diode 654 may be used to protect the NMOS transistor (n2) 646a. In other words, the n+ diffusion diode 652 may serve as the protective device to protect the PMOS transistor (n1) 644a, while the p+ diffusion diode 654 may serve as the protective device to protect the NMOS transistor (n2) 646a.

FIG. 6B shows a circuit 640b including an inverter 642b having a PMOS transistor (n1) 644b and an NMOS transistor (n2) 646b. The source (S) terminal of the PMOS transistor 644b may be coupled to a power supply line 648b, while the source (S) terminal of the NMOS transistor 646b may be coupled to a ground 650b. The drain (D) terminals of the PMOS transistor 644b and the NMOS transistor 646b may be coupled to each other. The gate (G) terminals of the PMOS transistor 644b and the NMOS transistor 646b may be coupled to each other, and may receive an input A. An output Q may be generated or derived at or from the drain (D) terminals of the PMOS transistor 644b and the NMOS transistor 646b.

The circuit 640b may further include a second NMOS transistor (n3) 653 and a second PMOS transistor (n4) 655. The gate (G) terminal and the source (S) terminal of the second NMOS transistor 653 may be coupled to each other, and may be further coupled to the source (S) terminal of the NMOS transistor 646b (and to the ground 650b). The gate (G) terminal and the source (S) terminal of the second PMOS transistor 655 may be coupled to each other, and may be further coupled to the source (S) terminal of the PMOS transistor 644b (and to the power supply line 648b). The drain (D) terminals of the second NMOS transistor 653 and the second PMOS transistor 655 may be coupled to each other, and may be further coupled to the drain (D) terminals of the PMOS transistor 644b and the NMOS transistor 646b.

In greater detail, a p+ diffusion region defining the drain (D) terminal of the PMOS transistor 644b may be coupled (or connected) to an n+ diffusion region defining the drain (D) terminal of the second NMOS transistor 653. An n+ diffusion region defining the drain (D) terminal of the NMOS transistor 646b may be coupled (or connected) to a p+ diffusion region defining the drain (D) terminal of the second PMOS transistor 655.

For the circuit 640b, the second NMOS transistor 653 and the second PMOS transistor 655 may respectively be used to protect the PMOS transistor 644b and the NMOS transistor 646b. In other words, the second NMOS transistor (n3) 653 may serve as the protective device to protect the PMOS transistor (n1) 644b, while the second PMOS transistor (n4) 655 may serve as the protective device to protect the NMOS transistor (n2) 646b.

It should be appreciated that the layout of the protective devices (the diodes 652, 654 or the second transistors 653, 655) is designed or laid out to at least substantially surround the respective transistors which are to be protected, which may be as illustrated in any one of FIGS. 4A, 5A, 5B and 5C.

Figure 6C:
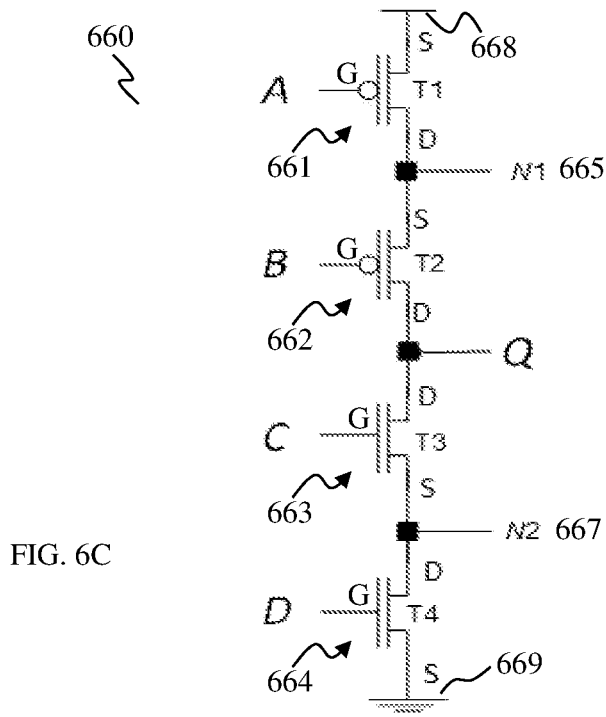

FIG. 6C shows a circuit 660 including a series connection of a plurality of transistors between a power supply line 668 and a ground 669. There may be two series PMOS transistors (T1 and T2) 661, 662, and two series NMOS transistors (T3 and T4) 663, 664. The source (S) terminal of the PMOS transistor 661 may be coupled to the power supply line 668. The drain (D) terminal of the PMOS transistor 661 and the source (S) terminal of the PMOS transistor 662 may be coupled to each other. The drain (D) terminal of the PMOS transistor 662 and the drain (D) terminal of the NMOS transistor 663 may be coupled to each other. The source (S) terminal of the NMOS transistor 663 and the drain (D) terminal of the NMOS transistor 664 may be coupled to each other. The source (S) terminal of the NMOS transistor 664 may be coupled to the ground 669. The gate (G) terminals of the PMOS transistors 661, 662, and the NMOS transistors 663, 664 may receive respective inputs A, B, C and D. An output Q may be derived from a node connecting the drain (D) terminals of the PMOS transistor 662 and the NMOS transistor 663.

A protective device (e.g., a diode having an n-type diffusion region, or an NMOS transistor) may be inserted and laid-out at node N1 665 to protect the drain (D) terminal of the PMOS transistor (T1) 661 and the source (S) terminal of the PMOS transistor (T2) 662. Correspondingly, another protective device (e.g., a diode having a p-type diffusion region, or a PMOS transistor) may be inserted and laid-out at node N2 667 to protect the drain (D) terminal of the NMOS transistor (T4) 664 and the source (S) terminal of the NMOS transistor (T3) 663. As described, a protective device may be employed to protect the respective source and drain regions of series transistors.

It should be appreciated that the layout of the protective devices is designed or laid out to at least substantially surround the respective transistors which are to be protected, which may be as illustrated in any one of FIGS. 4A, 5A, 5B and 5C.

As described herein, in various embodiments, there is provided a protective device for protecting an electrical element from single event effects, the electrical element having a drain diffusion area. The protective device may include a diffusion area having a polarity (or conductivity type) different from the polarity (or conductivity type) of the drain diffusion area of the electrical element. The diffusion area of the protective device may be connected to the drain diffusion area of the electrical element. The diffusion area of the protective element may be configured to substantially surround (laterally and/or vertically) the drain diffusion area of the electrical element.

In embodiments where the drain diffusion area of the electrical element may be n-doped, the diffusion area of the protective device may be p-doped, and vice versa. In various embodiments, the electrical element may be a PMOS transistor having a p+ drain diffusion area or an NMOS transistor having an n+ drain diffusion area.

Depending on the polarity (or conductivity type) of the drain diffusion area of the electrical element (e.g., p-doped or n-doped), the protective device may be implemented in the form of a diode having a p+ diffusion area, a diode having a n+ diffusion area, a PMOS transistor having a p+ drain diffusion area, or an NMOS transistor having an n+ drain diffusion area.

Figure 7:
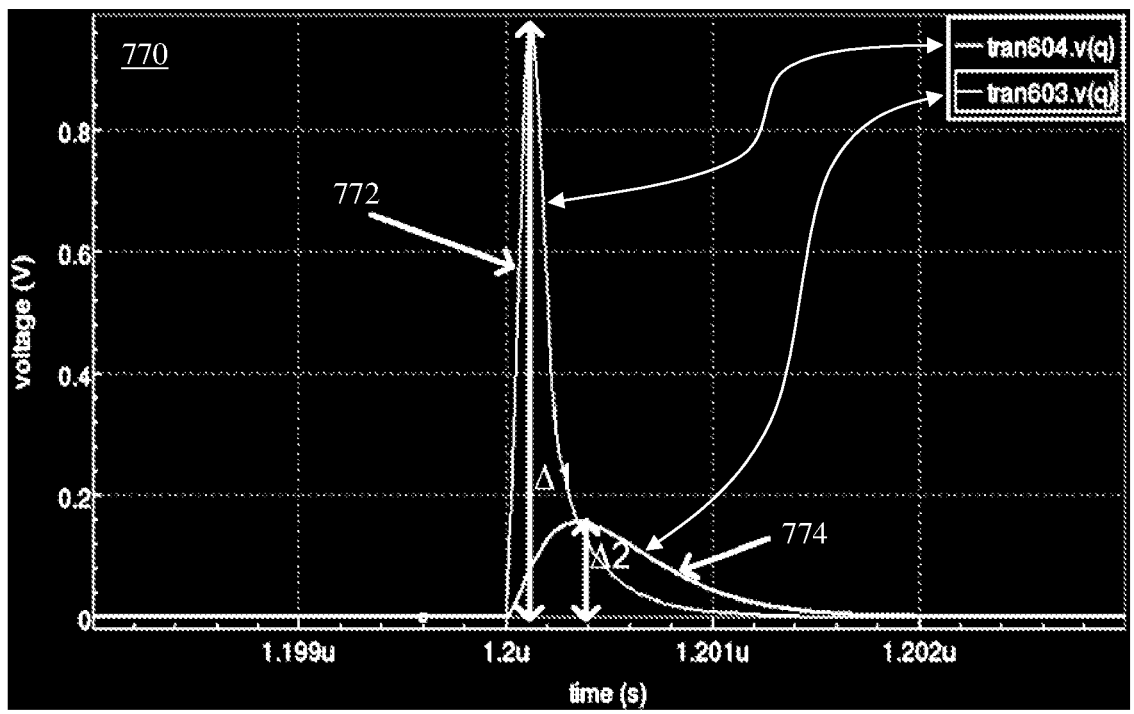
FIG. 7 shows a plot of simulation results of the irradiation effect at Linear Transfer Energy (LET) of about 50 MeV cm$^2$/mg for a standard inverter and a circuit with an inverter according to various embodiments.

FIG. 7 shows a plot 770 of simulation results of the irradiation effect at Linear Transfer Energy (LET) of about 50 MeV cm$^2$/mg for a standard inverter (i.e., an inverter without any protective device), and a circuit with an (RHBD) inverter according to various embodiments. The plot 770 shows the result 772 for the standard inverter and the result 774 for the RHBD inverter of various embodiments based on the design configuration of the circuit 640a illustrated in FIG. 6A. The funnel length is assumed to be 0.035 μm; the funnel length is the length of the induced channel to pass through a diffusion region by a radiation particle.

The results 772, 774 are for the two inverters at logic '0' (output) where their PMOS transistors are struck at 1.2 µs (time scale) with a high LET level of 50 MeV cm²/mg. The two inverters may be realized using 65 nm CMOS process where the supply voltage is 1.2 V, and are simulated using the Silvaco Radiation tool.

For the RHBD inverter of various embodiments, the drain area (or region) of the PMOS transistor (e.g., 644a, FIG. 6A) and the cathode (−) of the n+ diffusion diode (e.g., 652, FIG. 6A) may be struck at least substantially simultaneously, e.g., by a radiation particle. For the standard inverter, only the PMOS drain area may be struck. As shown in FIG. 7, the output (see result 772) of the standard inverter rises as much as 1 V (designated as "Δ1"), whereas that of the RHBD inverter (see result 774) rises as little as 0.16V (designated as "Δ2"). In other words, the SET induced in the standard inverter could be detrimental, whereas that induced in the RBHD inverter may be inconsequential even at high LET level.

Table 1 below tabulates a preliminary comparison of these two inverters. For ease of interpretation of the benchmarking, the figure-of-merit is calculated as the highest magnitude changed (Δ1) of SET in the standard inverter over the highest magnitude changed (Δ2) of the SET in the circuit with an inverter according to various embodiments. The standard inverter is normalized as 1×. The figure-of-merit indicates how much SET pulse reduction may be at various Linear Transfer Energy (LET) levels. As may be observed from Table 1, various embodiments may provide >6× pulse reduction at LET=50 MeV cm²/mg. It should be appreciated that SET protection may be possible or provided from all directions.

TABLE 1

Comparison With An Inverter Design (Based on Simulations):
SET Enhancement for various embodimetns @ 1.2 V, 65 nm CMOS With Various LET Levels (funnel Length is Assumed to be 0.035 µm)

| LET Level (MeV · cm²/mg) | Standard Inverter | Various embodiments (Δ1/Δ2) |
|---|---|---|
| 10 | 1x | 2.25x |
| 20 | 1x | 2.54x |
| 30 | 1x | 2.39x |
| 40 | 1x | 4.16x |
| 50 | 1x | 6.15x |

Table 2 below tabulates the reliability assessment up to LET=100 MeV cm²/mg for the standard inverter and the circuit with an (RHBD) inverter according to various embodiments. Two scenarios for the funnel length are considered, at about 0.035 µm and about 0.5 µm; the funnel length is introduced by the penetration of the radiation particles. For a 65 nm CMOS process, the funnel length of 0.035 µm may be considered the 'best-case' for the standard design where the SET is unlikely to be significant. Conversely, the funnel length of about 0.5 µm may be likely to be the typical case. An inverter is considered "FAIL" if the SET pulse is >half $V_{DD}$ change, i.e., more than half of the supply voltage.

TABLE 2

Simulated Reliability (Failure is considered if the magnitude Changed > half $V_{DD}$)

| LET Level (MeV · cm²/mg) | Funnel Length = 0.035 µm (the 'best-case' for the standard) | | Funnel Length = 0.5 µm (typical-case) | |
|---|---|---|---|---|
| | Standard | Embodiments | Standard | Embodiments |
| 10 | PASS | PASS | FAIL | PASS |
| 20 | PASS | PASS | FAIL | PASS |
| 30 | PASS | PASS | FAIL | PASS |
| 40 | FAIL | PASS | FAIL | PASS |
| 50 | FAIL | PASS | FAIL | PASS |
| 60 | FAIL | PASS | FAIL | PASS |
| 70 | FAIL | PASS | FAIL | PASS |
| 80 | FAIL | PASS | FAIL | PASS |
| 90 | FAIL | PASS | FAIL | PASS |
| 100 | FAIL | PASS | FAIL | PASS |

As may be observed from Table 2, when the funnel length is assumed to be about 0.035 µm, the standard inverter fails when LET≥40 MeV cm²/mg whereas the circuit with RHBD inverter of various embodiments may still be reliable at LET=100 MeV cm²/mg. When the funnel length is assumed to be about 0.5 µm, the standard inverter fails when LET≥10 MeV cm²/mg, whereas the circuit with RHBD inverter of various embodiments may still be reliable at LET=100 MeV cm²/mg. Therefore, various embodiments may be highly effective to mitigate SETs/SEUs.

Having provided some non-limiting examples of various embodiments and their features and the potential improvements over the prior art, as described herein, it should be appreciated that various embodiments may be applicable for designing any circuit (digital or analog), for example, based on the device-cum-layout technique illustrated in FIGS. 5A to 5C.

It should also be appreciated that various embodiments may be applicable for designing any circuit, with one or more possible suitable modifications, for example, including the change of the layout shape for the diffusion area of the protective device as long as the protective device is arranged or laid out (laterally or vertically) to protect a transistor within the circuit.

Further, it should be appreciated that various embodiments may be applicable for designing the protective device using various circuit structures (e.g., diodes, NMOS, PMOS, logic) as long as the protective device has the opposite diffusion polarity (or conductivity type) to the diffusion polarity (or conductivity type) of the transistor which is to be protected.

As described herein, as compared to prior art, various embodiments may provide increased flexibility in design and/or increased probability of protection. In various embodiments, a protective device may be independently and flexibly inserted at any node of a circuit to protect an electrical device that may need protection.

Various embodiments may be employed in various applications, including relating to circuits/systems for space and satellite (S&S) applications. Other applications may include defence, security and high-reliable applications, including autonomous vehicles.

One non-limiting example application may pertain to digital cell libraries for any digital circuits and systems for S&S applications. Digital cell libraries incorporating various embodiments may feature low SET, and may be rudimentary to design any systems, small or large. It is envisioned that the digital cell libraries may provide a unique and niche need for satellite applications (e.g., pico-satellites, nano-satellites, macro-satellites in Low-Earth-Orbit (LEO), and big satellites in Geosynchronous-Earth Orbit (GEO)).

Another application may pertain to analog power management circuits where critical transistors may be protected by means of various embodiments. The analog power management is universally sough-after for any S&S applications.

A further application may pertain to high-reliable applications where the systems therein may be highly desirable to suppress any unwanted noises. The application domains include maritime, deep-sea, oil industry, autonomous vehicles, etc.

However, it should be appreciated that various embodiments are not limited to areas/applications where reliability may be an issue.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit comprising:
a first electrical device comprising a transistor, the transistor comprising a first region of a first conductivity type, wherein the first region comprises a drain region of the transistor;
a second electrical device comprising a second region of a second conductivity type, wherein a functionality of the second electrical device is independent of the transistor,
wherein the first region and the second region are electrically coupled to each other, and
wherein one of the first and second regions is arranged to surround the other of the first and second regions over an angle of about 180° or more by extending the one of the first and second regions along two or more of length, width and thickness of the other of the first and second regions;
a third electrical device comprising a different type of transistor, the different type of transistor comprising a third region of the second conductivity type, wherein the third region comprises a drain region of the different type of transistor;
a fourth electrical device comprising a fourth region of the first conductivity type, wherein a functionality of the fourth electrical device is independent of the different type of transistor,
wherein the third region and the fourth region are electrically coupled to each other, and
wherein one of the third and fourth regions is arranged to surround the other of the third and fourth regions over an angle of about 180° or more by extending the one of the third and fourth regions along two or more of length, width and thickness of the other of the third and fourth regions.

2. The circuit as claimed in claim 1, wherein the one of the first and second regions is arranged to entirely surround the other of the first and second regions.

3. The circuit as claimed in claim 1,
wherein the transistor comprises a PMOS transistor,
wherein the first conductivity type is a p-type conductivity, and
wherein the second conductivity type is an n-type conductivity, and
wherein the second region is arranged to surround the first region.

4. The circuit as claimed in claim 1,
wherein the transistor comprises an NMOS transistor,
wherein the first conductivity type is an n-type conductivity, and
wherein the second conductivity type is a p-type conductivity, and
wherein the second region is arranged to surround the first region.

5. The circuit as claimed in claim 3,
wherein the second electrical device comprises an NMOS transistor, and
wherein the second region comprises a drain region.

6. The circuit as claimed in claim 4,
wherein the second electrical device comprises a PMOS transistor, and
wherein the second region comprises a drain region.

7. The circuit as chimed in claim 1, wherein the second electrical device comprises a diode.

8. The circuit as claimed in claim 1, wherein the one of the third and fourth regions is arranged to entirely surround the other of the third and fourth regions.

9. The circuit as claimed in claim 1, wherein the first region and the third region are electrically coupled to each other.

10. The circuit as claimed in claim 1,
wherein the fourth region is arranged to surround the third region.

11. The circuit as chimed in claim 1,
wherein the fourth electrical device comprises a transistor, and
wherein the fourth region comprises a drain region.

12. The circuit as claimed in claim 1, wherein the fourth electrical device comprises a diode.

13. The circuit as claimed in claim 1, wherein the first region and the second region are spaced apart from each other.

* * * * *